US006512263B1

(12) United States Patent
Yuan et al.

(10) Patent No.: US 6,512,263 B1
(45) Date of Patent: Jan. 28, 2003

(54) NON-VOLATILE MEMORY CELL ARRAY HAVING DISCONTINUOUS SOURCE AND DRAIN DIFFUSIONS CONTACTED BY CONTINUOUS BIT LINE CONDUCTORS AND METHODS OF FORMING

(75) Inventors: Jack H. Yuan, Cupertino, CA (US); Jacob Haskell, Palo Alto, CA (US)

(73) Assignee: SanDisk Corporation, Sunnyvale, CA (US)

( * ) Notice: Subject to any disclaimer, the term of this patent is extended or adjusted under 35 U.S.C. 154(b) by 33 days.

(21) Appl. No.: 09/667,344

(22) Filed: Sep. 22, 2000

(51) Int. Cl.[7] .......................................... H01L 29/788
(52) U.S. Cl. ................. 257/316; 257/315; 257/326; 438/201; 438/211; 438/257; 438/241; 438/266; 438/258
(58) Field of Search ................. 257/315, 316, 257/326; 438/201, 211, 257, 266, 241, 258

(56) References Cited

U.S. PATENT DOCUMENTS

| 4,336,603 A | 6/1982 | Kotecha et al. ......... 365/185.3 |
| 4,380,057 A | 4/1983 | Kotecha et al. ............ 365/184 |
| 4,417,264 A | 11/1983 | Angle ................... 365/185.4 |
| 4,477,825 A | 10/1984 | Yaron et al. ................ 257/321 |
| 4,855,955 A | 8/1989 | Cioaca .................. 365/185.19 |
| 4,885,719 A | 12/1989 | Brahmbhatt .......... 365/185.17 |
| 5,021,999 A | 6/1991 | Kohda et al. .......... 365/185.03 |
| 5,043,940 A | 8/1991 | Harari ................... 365/185.03 |
| 5,047,362 A | 9/1991 | Bergemont ................ 438/257 |
| 5,070,032 A | 12/1991 | Yuan et al. ................. 438/267 |
| 5,095,344 A | 3/1992 | Harari ......................... 257/328 |
| 5,095,461 A | 3/1992 | Miyakawa et al. .... 365/185.14 |
| 5,159,570 A | 10/1992 | Mitchell et al. ....... 365/185.03 |
| 5,172,338 A | 12/1992 | Mehrotra et al. ...... 365/185.03 |
| 5,210,047 A | 5/1993 | Woo et al. .................. 438/257 |

(List continued on next page.)

FOREIGN PATENT DOCUMENTS

| EP | 0 051 158 B1 | 10/1981 |
| JP | 55-43862 | 3/1980 |
| JP | 58-222561 | 12/1983 |
| JP | 07-226449 | 8/1995 |
| WO | WO 95/19047 | 7/1995 |

OTHER PUBLICATIONS

Alberts and Kotecha, "Multi–Bit Storage Fet Earom Cell", IBM Technical Disclosure Bulletin, vol. 24, No. 7A, Dec. 1981, pp. 3311–3314.

Kamiya et al., "EPROM Cell With High Gate Injection Efficiency", Int'l Electron Devices Meeting Technical Digest, 1982, pp. 741–744.

Pein and Plummer, "Performance of the 3–D Sidewall Flash EPROM Cell", Int'l Electron Devices Meeting Technical Digest, 1993, pp. 2.1.1–3.5.4.

(List continued on next page.)

Primary Examiner—Nathan J. Flynn
Assistant Examiner—Scott R. Wilson
(74) Attorney, Agent, or Firm—Skjerven Morrill LLP

(57) ABSTRACT

Rows of memory cells are electrically isolated from one another by trenches formed in the substrate between the rows that are filled with a dielectric, commonly called "shallow trench isolation" or "STI." Discontinuous source and drain regions of the cells are connected together by column oriented bit lines, preferably made of doped polysilicon, that extend in the column direction on top of the substrate. This structure is implemented in a flash memory array of cells having either one floating gate per cell or at least two floating gates per cell. A process of making a dual-floating gate memory cell array includes etching the word lines twice along their lengths, once to form openings through which source and drain implants are made and in which the conductive bit lines are formed, and second to form individual floating gates with a select transistor gate positioned between them that also serves to erase charge from the adjacent floating gates.

17 Claims, 7 Drawing Sheets

U.S. PATENT DOCUMENTS

| | | | |
|---|---|---|---|
| 5,278,439 A | 1/1994 | Ma et al. | 257/319 |
| 5,297,148 A | 3/1994 | Harari et al. | 714/710 |
| 5,313,421 A | 5/1994 | Guterman et al. | 365/185.15 |
| 5,315,341 A | 5/1994 | Harari et al. | 365/185.13 |
| 5,343,063 A | 8/1994 | Yuan et al. | 257/317 |
| 5,364,806 A | 11/1994 | Ma et al. | 438/266 |
| 5,411,905 A | 5/1995 | Acovic et al. | 438/156 |
| 5,412,600 A | 5/1995 | Nakajima | 365/185.17 |
| 5,414,693 A | 5/1995 | Ma et al. | 365/185.1 |
| 5,440,158 A | 8/1995 | Sung-Mu | 257/314 |
| 5,486,714 A | 1/1996 | Hong | 257/321 |
| 5,492,846 A | 2/1996 | Hara | 438/260 |
| 5,576,567 A | 11/1996 | Mori | 257/316 |
| 5,606,521 A | 2/1997 | Kuo et al. | 365/149 |
| 5,616,510 A | 4/1997 | Wong | 438/259 |
| 5,636,160 A | 6/1997 | Omino et al. | 365/185.02 |
| 5,643,814 A | 7/1997 | Chung | 438/259 |
| 5,661,053 A | 8/1997 | Yuan | 438/257 |
| 5,679,591 A | 10/1997 | Lin et al. | 438/257 |
| 5,712,180 A | 1/1998 | Guterman et al. | 438/263 |
| 5,714,412 A | 2/1998 | Liang et al. | 438/266 |
| 5,786,612 A | 7/1998 | Otani et al. | 257/316 |
| 5,812,449 A | 9/1998 | Song | 365/185.03 |
| 5,851,879 A | 12/1998 | Lin et al. | 438/257 |
| 5,991,201 A | 11/1999 | Kuo et al. | 365/185.19 |
| 6,091,633 A | 7/2000 | Cernea et al. | 365/185.13 |
| 6,103,573 A * | 8/2000 | Harari et al. | 438/257 |
| 6,151,248 A | 11/2000 | Harari et al. | 365/185.14 |
| 6,329,685 B1 * | 12/2001 | Lee | 257/314 |

OTHER PUBLICATIONS

Ma et al., "A Dual–bit Split–Gate EEPROM (DSG) Cell in Contactless Array for Single–Vcc High Density Flash Memories", Int'l Electron Devices Meeting Technical Digest, 1994, pp. 3.5.1–3.5.4.

Kuo et al., TEFET—A High Density, Low Erase Voltage, Trench Flash EEPROM, 1994 Symposium on VLSI Technology, pp. 51–52.

PCT International Search Report, International Application No. PCT/US01/29405, Apr. 12, 2002, 3 pages.

* cited by examiner

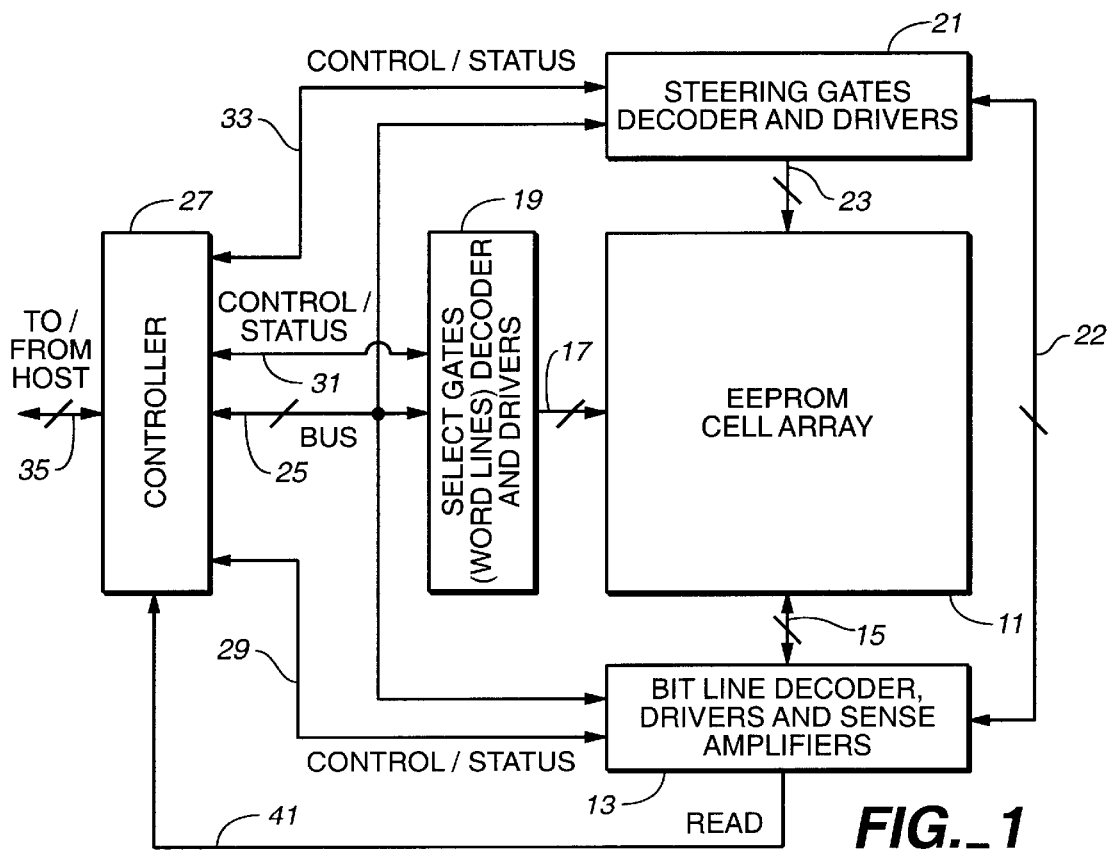
FIG._1
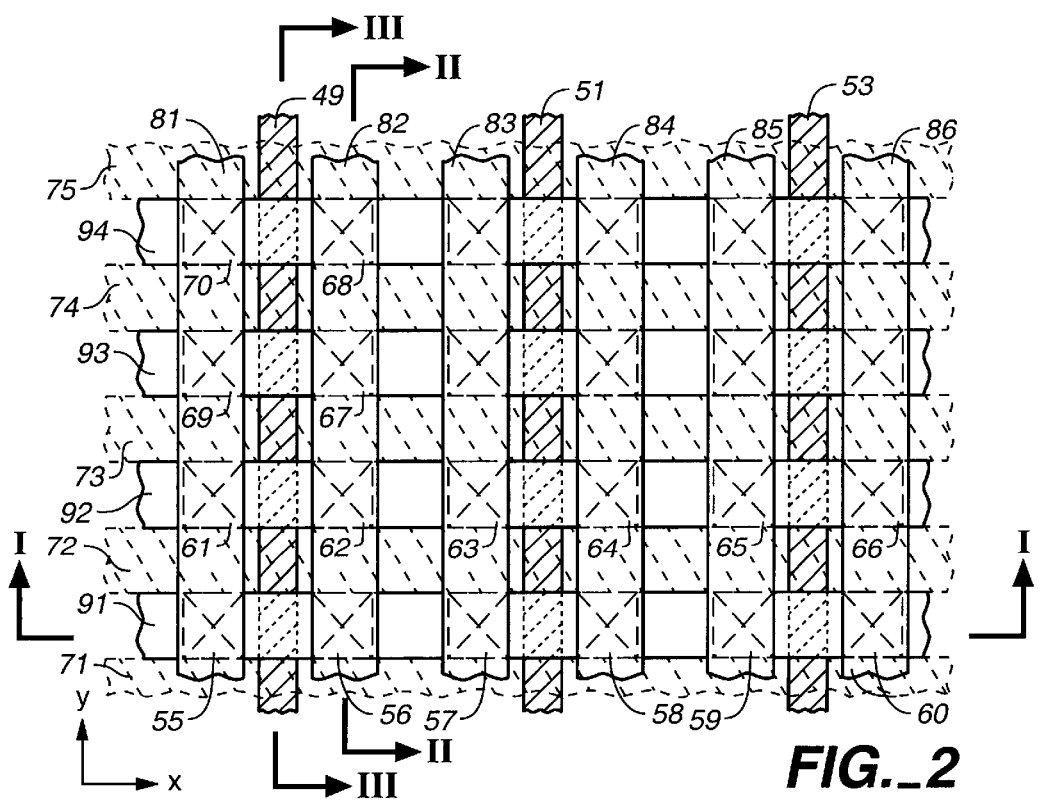
FIG._2

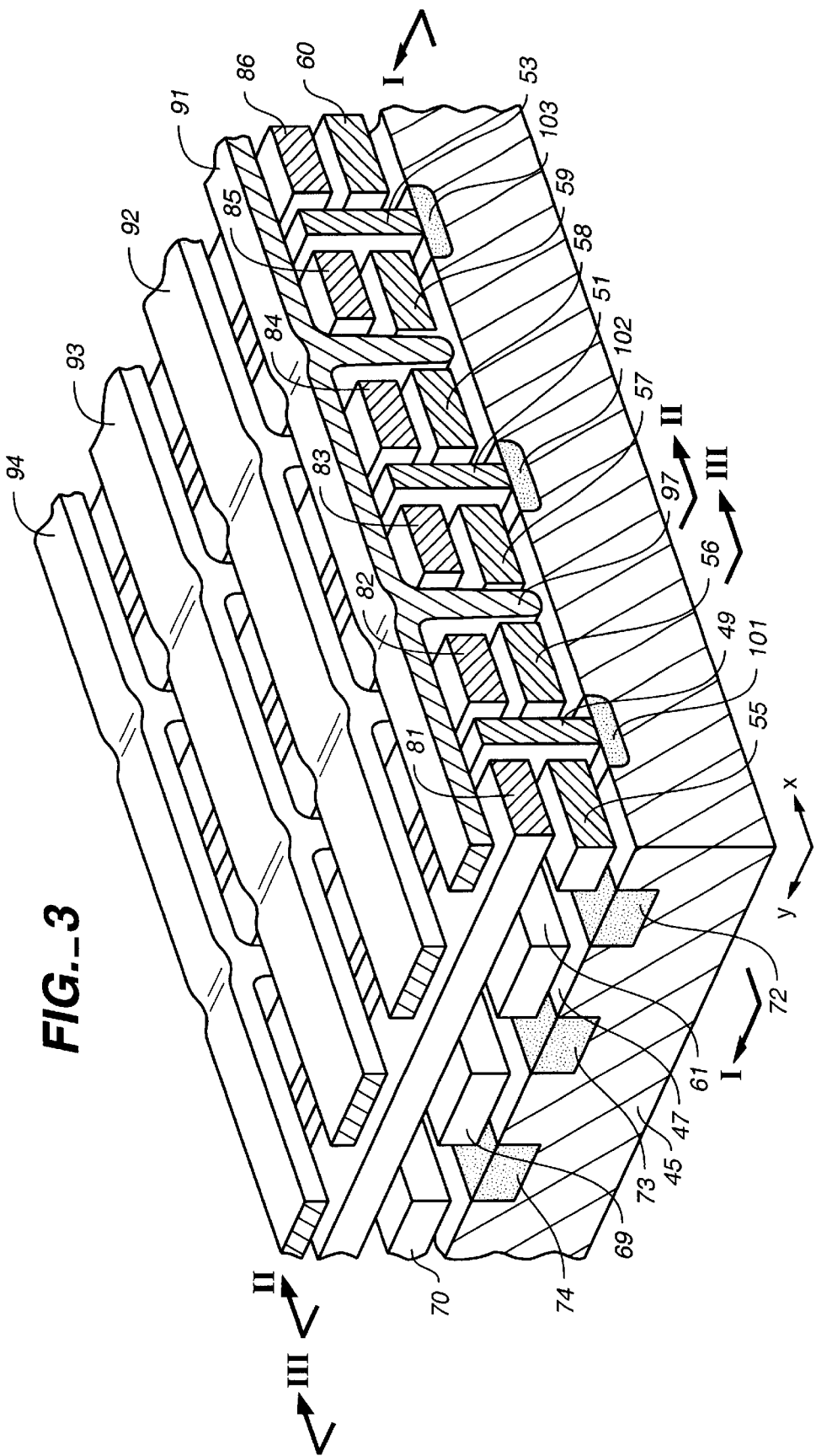
FIG._3

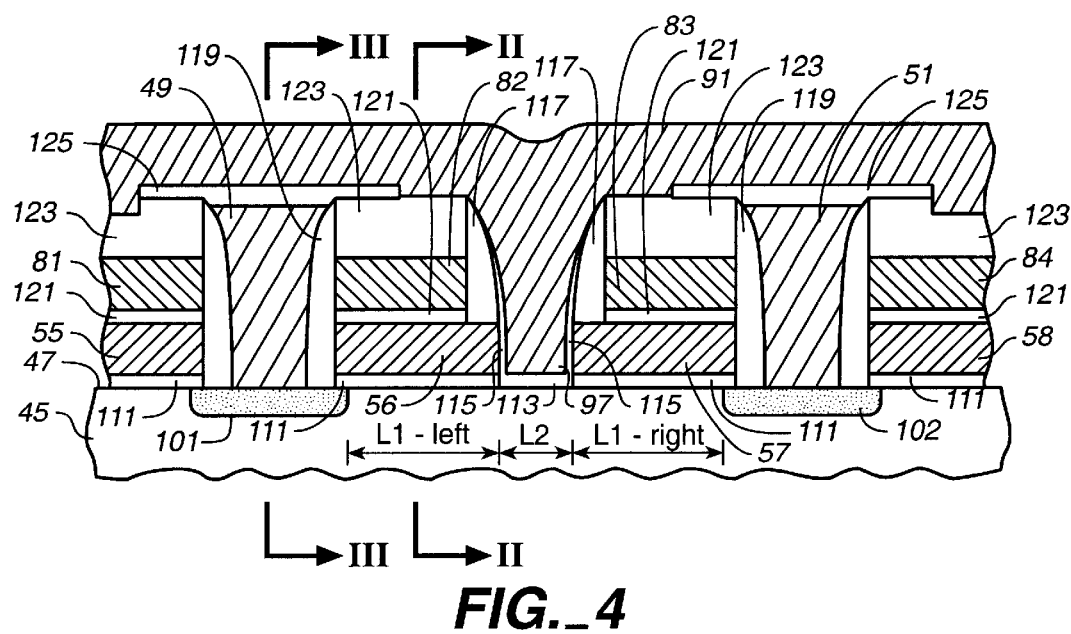
FIG._4
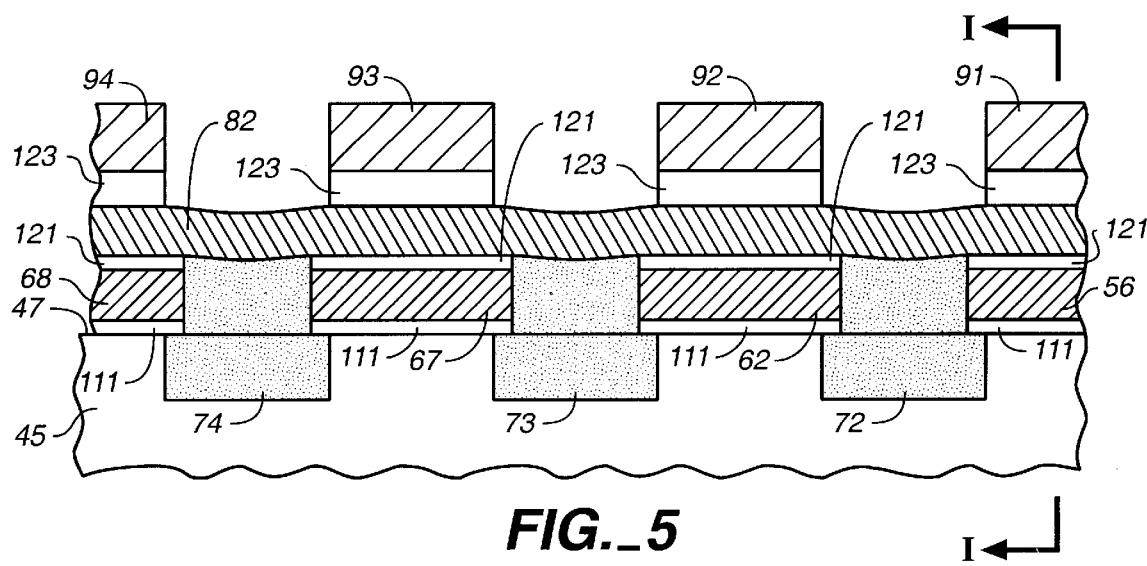
FIG._5

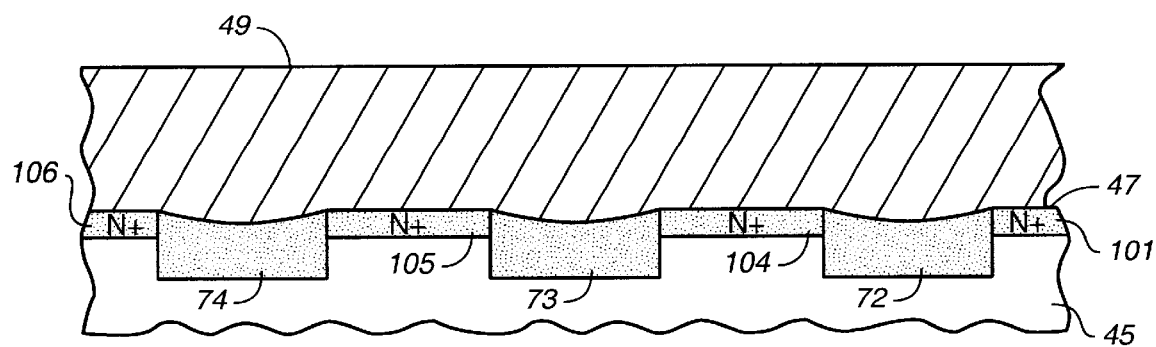
FIG._6
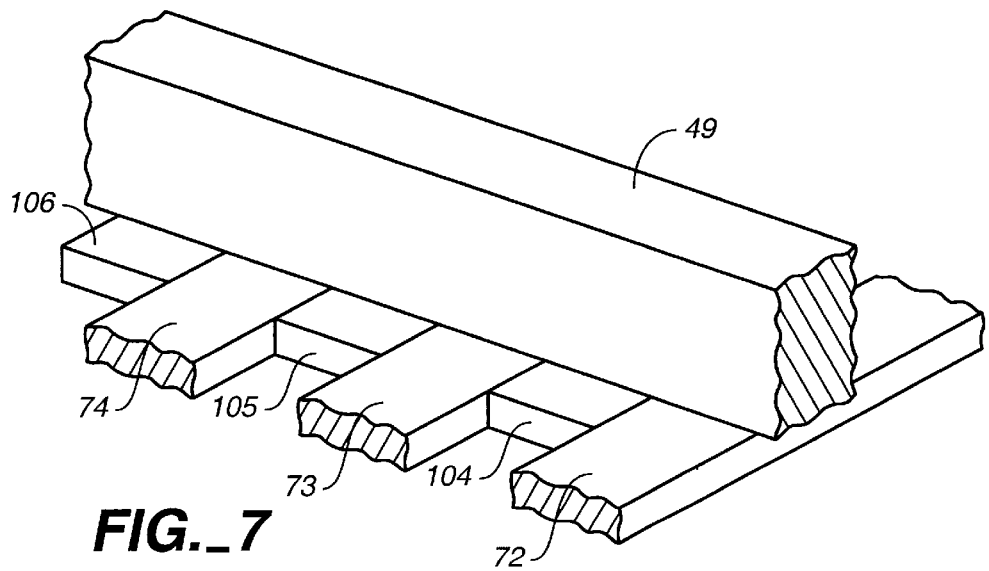
FIG._7
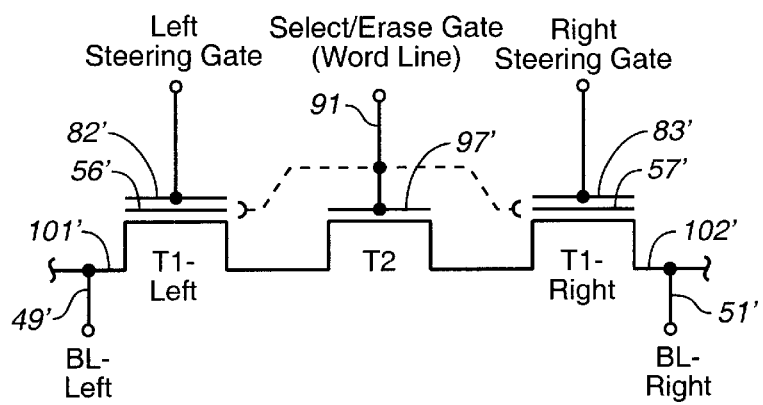
FIG._8

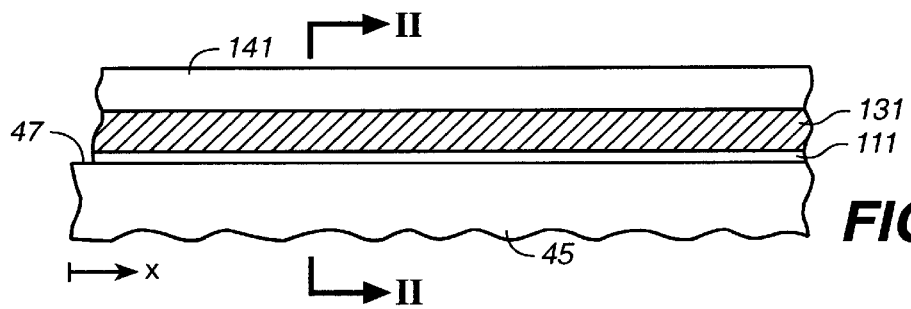
FIG._9A
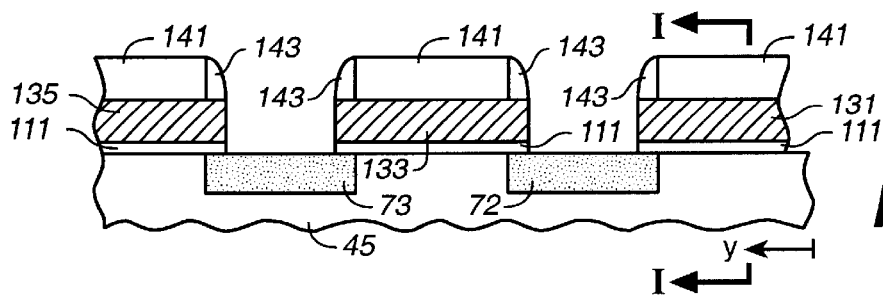
FIG._9B
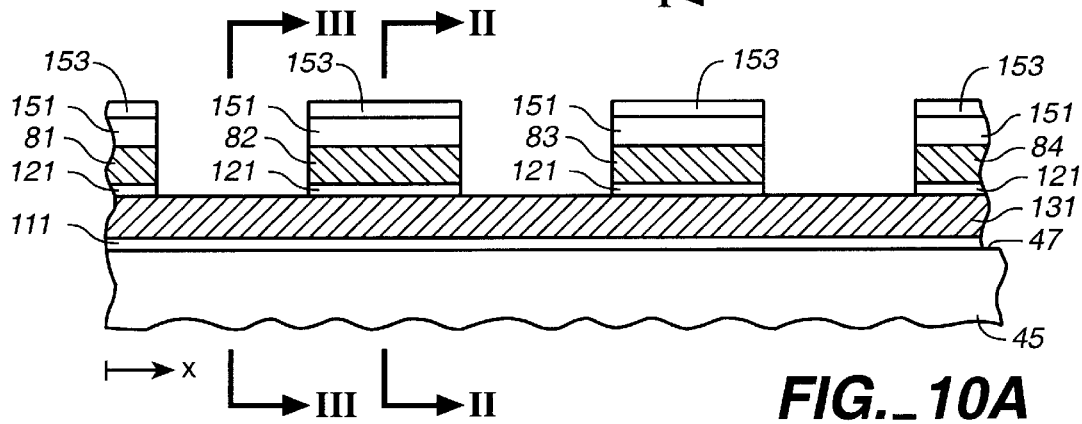
FIG._10A
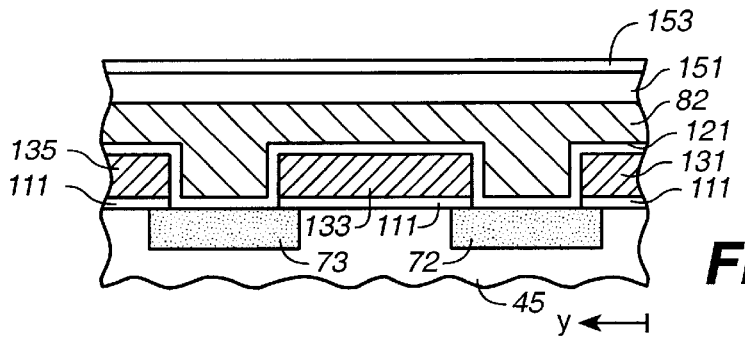
FIG._10B
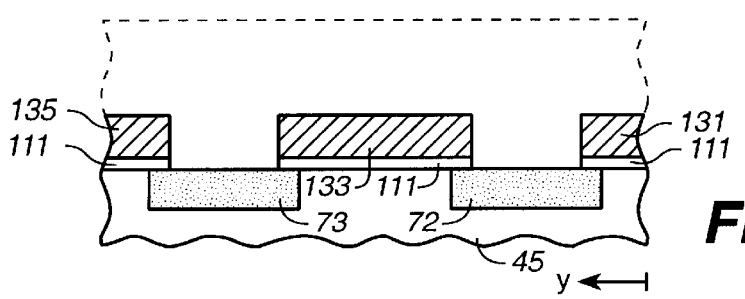
FIG._10C

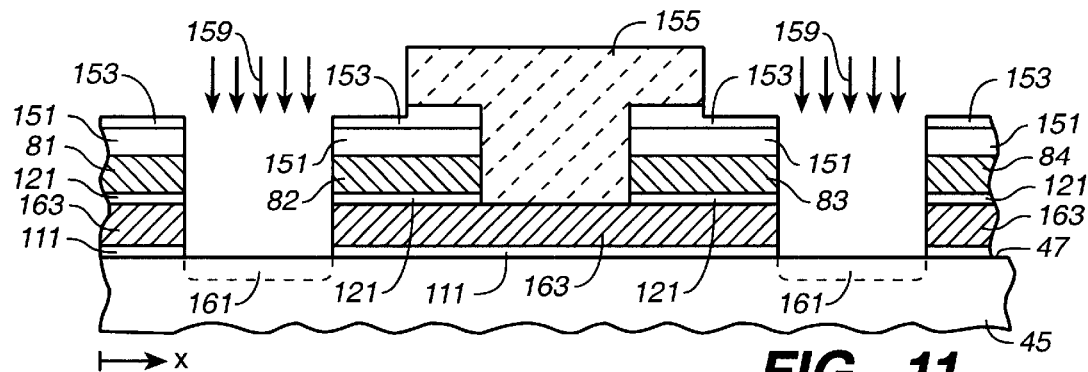
FIG._11
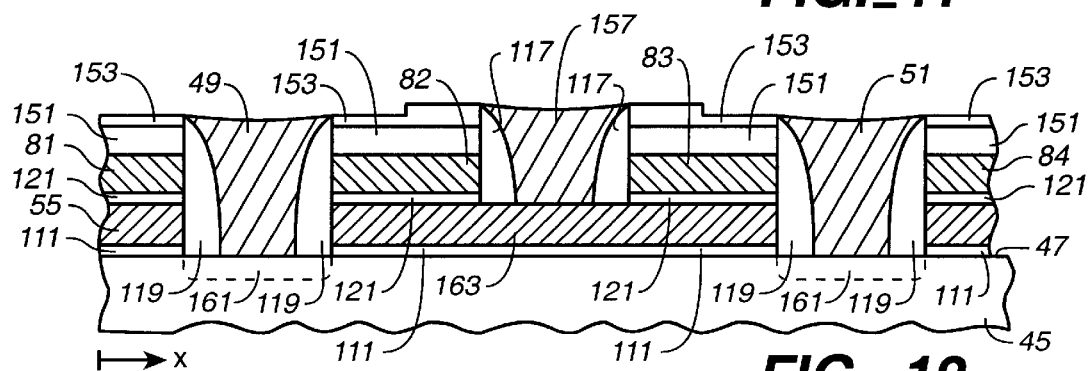
FIG._12
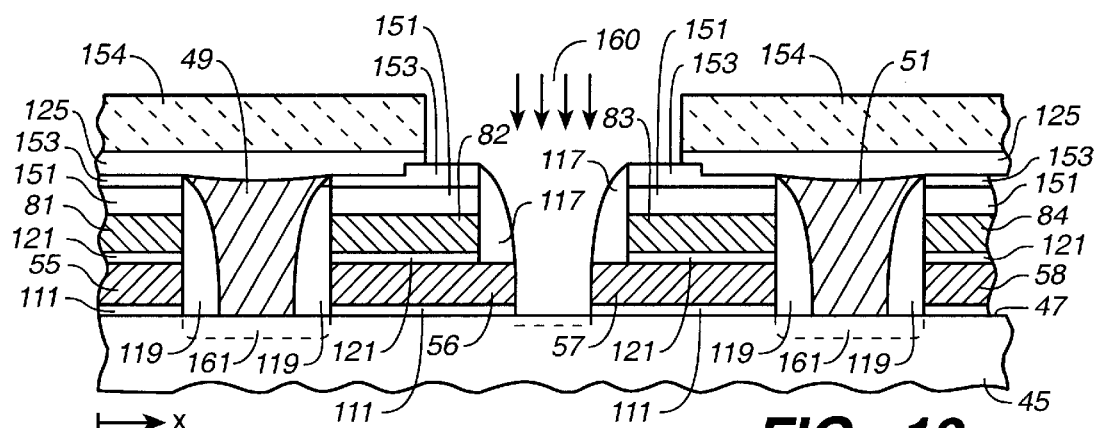
FIG._13
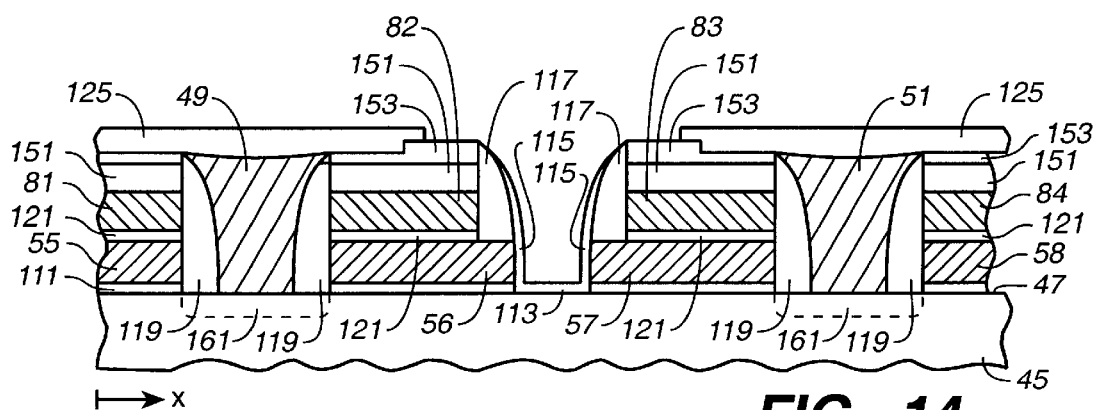
FIG._14

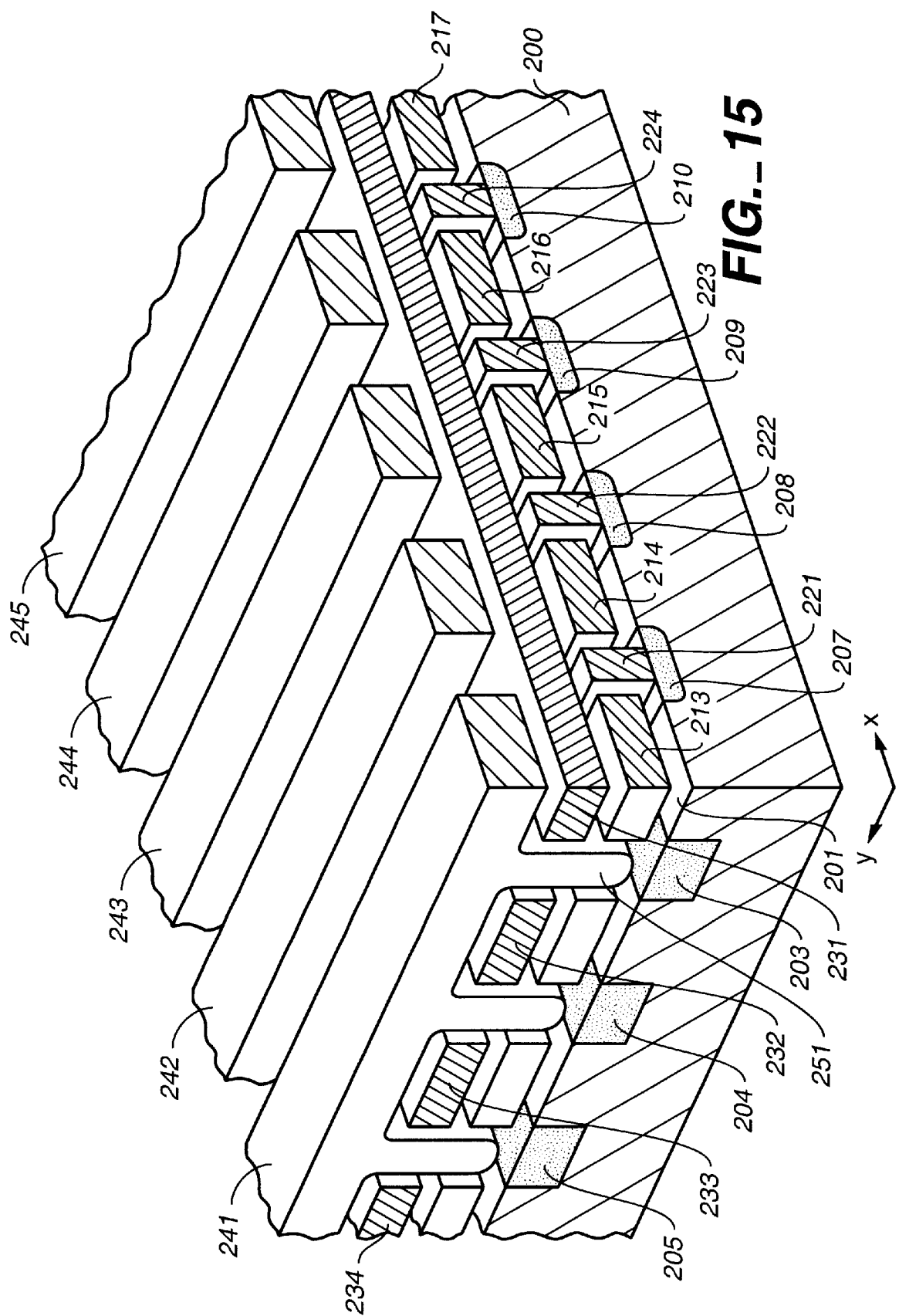
FIG._15

NON-VOLATILE MEMORY CELL ARRAY HAVING DISCONTINUOUS SOURCE AND DRAIN DIFFUSIONS CONTACTED BY CONTINUOUS BIT LINE CONDUCTORS AND METHODS OF FORMING

CROSS-REFERENCE TO RELATED APPLICATIONS

This application is related to patent applications Ser. No. 09/343,328 of Eliyahou Harari, Daniel C. Guterman, George Samachisa and Jack H. Yuan, filed Jun. 30, 1999, now U.S. Pat. No. 6,151,248, Ser. No. 09/343,493 of Eliyahou Harari, Jack H. Yuan and George Samachisa, filed Jun. 30, 1999, now U.S. Pat. No. 6,103,573, and Ser. No. 09/370,775 of Raul-Adrian Cemea and George Samachisa, filed Aug. 9, 1999, now U.S. Pat. No. 6,091,633, each of which is incorporated herein in its entirety by this reference.

BACKGROUND OF THE INVENTION

This invention relates generally to flash EEPROM (Electrically Erasable and Programmable Read Only Memory) systems, and, more specifically, to memory arrays of flash EEPROM cells that individually contain two floating gates and to systems that utilize them.

There are many commercially successful non-volatile memory products being used today, particularly in the form of small form factor cards, which use a flash EEPROM array of cells having a "split-channel" between source and drain diffusions. The floating gate of the cell is positioned over one portion of the channel and the word line (also referred to as a control gate) is positioned over the other channel portion as well as the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and in co-pending U.S. patent application Ser. No. 09/239,073, filed Jan. 27, 1999, which patents and application are incorporated herein by this reference.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. No. 5,313,421 and co-pending application Ser. No. 08/910,947, filed Aug. 7, 1997, which patent and application are incorporated herein by this reference.

In either of the two types of memory cell arrays described above, the floating gate of a cell is programmed by injecting electrons from the substrate to the floating gate. This is accomplished by having the proper doping in the channel region and applying the proper voltages to the source, drain and remaining gate(s). So called "source side" injection is preferred, which is also described in the foregoing U.S. Pat. No. 5,313,421.

Two techniques for removing charge from floating gates to erase memory cells are used in both of the two types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making a compromise because of the two functions. When either erase technique is utilized, a large number of memory cells are grouped together for simultaneously erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sector's worth of data. Multi-block erasure, defect management and other flash EEPROM system features are described in U.S. Pat. No. 5,297,148, which patent is incorporated herein by this reference.

As in most all integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

Therefore, in order to further increase data storage density, a flash EEPROM system using a dual floating gate memory cell is being utilized along with the storage of multiple states on each floating gate. In this type of cell, two floating gates are included over its channel between source and drain diffusions with a select transistor in between them. A steering gate is included along each column of floating gates and a word line is provided thereover along each row of floating gates. When accessing a given floating gate for reading or programming, the steering gate over the other floating gate of the cell containing the floating gate of interest is raised sufficiently high to turn on the channel under the other floating gate no matter what charge level exists on it. This effectively eliminates the other floating gate as a factor in reading or programming the floating gate of interest in the same memory cell. For example, the amount of current flowing through the cell, which can be used to read its state, is then a function of the amount of charge on the floating gate of interest but not of the other floating gate in the same cell. This cell array architecture and operating techniques are described in U.S. Pat. No. 5,712,180 and co-pending application Ser. No. 08/910,947, filed Aug. 7, 1997, which patent and application are incorporated herein by this reference.

SUMMARY OF THE INVENTION

The present invention includes a non-volatile memory cell array architecture that provides high data storage density, the ability to scale its size downward in the future to take advantage of improvements in processing technology and which is practical to build with standard integrated circuit processing techniques. Briefly and generally, closely spaced rows of memory cells are electrically isolated from one another with trenches into the substrate that are filled with a dielectric, according to the shallow trench isolation (STI) technique. Application of high voltages (12 volts or more within a flash EEPROM array) to program memory cells in one row does not then disturb operation of the memory cells of an adjacent row. Since this isolation also interrupts the source and drain substrate diffusions that normally extend between the rows in prior arrays, the isolated source and drain memory cell diffusions are connected together by bit lines formed above the substrate surface to extend in the column direction. This architecture can be used with arrays of memory cells having one or more charge retaining storage elements, usually floating gates, per cell. This arrangement also allows erase gates to be included in the array.

The present invention also includes processing improvements that permit the array to be made very small now and also retain the ability to be scaled down in the future. Briefly and generally, an array of cells that individually include two floating gates between a source and a drain, plus a select transistor between the two floating gates, are made, after the shallow trench isolation has been provided between the rows, by separating a first layer of gate material into the floating gates in two steps. In one separation step, the source and drain implants are defined by removing gate material in the regions of the implants by alignment with edges of strips of a second gate material layer overlying the first layer and which form steering gates. After the implants are made through these openings, elongated conductive bit lines are formed above the substrate across multiple rows to interconnect a plurality of source and drain diffusions in a column. In a subsequent separation step, the channel regions of the select transistors of the individual cells are exposed by removing portions of the first gate material layer by alignment with edges of the steering gates on either side. The first gate material layer has then been separated into the array's floating gates. Word lines that extend into these openings between floating gates are next formed from a third layer of gate material. The resulting select transistor gates are preferably also coupled to edges of the adjacent floating gates through tunnel dielectric in order to also act as erase gates for those floating gates.

Additional features and advantages of the various aspects of the present invention are included in the following description of exemplary embodiments, which description should be taken in conjunction with the accompanying drawings.

BRIEF DESCRIPTION OF THE DRAWINGS

FIG. 1 illustrates in block diagram form a flash EEPROM system utilizing the present invention;

FIG. 2 is an exemplary plan view of a dual floating gate per cell memory array that incorporates the present invention;

FIG. 3 is an isometric view of the memory cell array of FIG. 2;

FIG. 4 is a sectional view of the memory cell array of FIGS. 2 and 3, taken at section I—I thereof;

FIG. 5 is a sectional view of the memory cell array of FIGS. 2–4, taken at section II—II thereof;

FIG. 6 is a sectional view of the memory cell array of FIGS. 2–4, taken at section III—III thereof;

FIG. 7 is an isometric view of certain elements of the memory cell array of FIGS. 2–6 with other elements removed from the view;

FIG. 8 is an equivalent electrical circuit of the memory cell array of FIGS. 2–6;

FIGS. 9A and 9B are sectional views of the memory cell embodiment of FIGS. 2–6, partially constructed, after a number of processing steps have been completed, taken at respective sections I—I and II—II thereof;

FIGS. 10A, 10B and 10C are sectional views of the memory cell embodiment of FIGS. 2–6, partially constructed, after an additional number of processing steps have been completed, taken at respective sections I—I, II—II and III—III thereof;

FIGS. 11–14 are sectional views of the memory cell embodiment of FIGS. 2–6, partially constructed, all taken at section I—I thereof; showing the effects of further processing steps on the structure; and FIG. 15 is an isometric view of a single floating gate per cell memory array that incorporates the present invention.

DESCRIPTION OF EXEMPLARY EMBODIMENTS

An example memory system incorporating the various aspects of the present invention is generally illustrated in the block diagram of FIG. 1. A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the Compact-Flash™ Association, the MMC™ Association, the Secure Digital (SD) Card Association, and others. When in a card format, the lines 35 terminate in a connector on the card which interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 1 are embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. Any status signals, including voltage levels and other array parameters, are provided by the array 11 to the controller 27 over the same control and status lines 29, 31 and 33. A plurality of sense amplifiers within the circuit 13 receive current or voltage levels that are indicative of the states of addressed memory cells within the array 11, and provides the controller 27 with information about those states over lines 41 during a read operation. A large number of sense amplifiers are usually used in order to be able to read the states of a large number of memory cells in parallel. During reading and program operations, one row of cells is typically addressed at a time through the circuits 19 for accessing a number of cells in the addressed row that are selected by the circuits 13 and 21. During an erase operation, all cells in each of many rows are typically addressed together as a block for simultaneous erasure.

Two specific embodiments of the memory cell array 11 are shown in the drawings, a first embodiment where the individual memory cells have two floating gates and a select transistor, FIGS. 2–8, and a second embodiment where the memory cells individually include a single floating gate and no select transistor, FIG. 13. The remaining FIGS. 9–12 illustrate processing steps of making the embodiment of FIGS. 2–8. The general FIGS. 3 and 13 show the substrate and doped polysilicon elements of the memory cell arrays with little detail of dielectric layers that exist therebetween. This simplifies the Figures but it will be understood that appropriate oxide layers, those both grown and deposited, deposited silicon nitride layers, and other dielectrics commonly used are to be included between the polysilicon elements themselves, and between the polysilicon elements and the substrate. Indeed, FIGS. 4–6 include such dielectric layers, and process cross-sections of FIGS. 9–12 do as well.

Dual Floating Gate Memory Cell Array Embodiment

The first array embodiment is illustrated in FIGS. 2–6, where a small part of its repetitive structure is included. A usual silicon semiconductor substrate 45 includes a planar top surface 47. A two dimensional pattern of floating gates in rows and columns is included, each being carried by the substrate surface 47 with a suitable gate dielectric therebetween. One row includes floating gates 55–60, and floating gates 61–66 are in an adjacent row. Floating gates 55, 61, 69 and 70 are in the same column, with an adjacent column including floating gates 56, 62, 67 and 68. In order to provide a convention for this description, rectangular coordinates are established with a first "x" direction and a second "y" direction, these first and second directions being essentially orthogonal with each other. The floating gates are formed from a first layer of gate material, preferably doped polycrystalline silicon ("polysilicon") that is deposited over the entire surface and then separated, by etching through masks, into the individual floating gates, in a manner described below with respect to FIGS. 9–12.

In order to provide a high degree of electrical isolation between rows of cells, dielectric filled trenches, such as trenches 72, 73 and 74, are positioned between the rows. At an early stage in the processing, as described further below, parallel trenches are etched in the surface 47 of the substrate 45, and a dielectric, such as an oxide, is then deposited in them. This type of isolation is known as "shallow trench isolation," or "STI." It replaces field oxide strips that are usually formed between rows in such memory arrays as, for example, by a well known local oxidation technique "LOCOS." The desire to space the rows very closely together, in order to increase the data density of the array, and the need to apply relatively high voltages to memory cell elements during the memory's operation, combine to create the need STI which offers better isolation. Further, problems encountered at the edges of the grown field oxide barriers, with their so called "bird's beak," do not exist with dielectric filled trenches.

Source and drain diffusions are shared among memory cells along rows but do not extend between rows along columns. Because of the isolation trenches between the rows, elongated diffusions do not extend along columns of memory cells to form bit lines, as they do in prior forms of such memory arrays. Adjacent diffusions 101, 102 and 103, for example, each have two floating gates between them along a single row, gates 56 & 57 of one memory cell, and gates 58 & 59 of an adjacent memory cell, respectively. In the y-direction, as best illustrated by FIG. 6, the memory cell source and drain diffusions do not extend between rows. Diffusions 101, 104, 105 and 106 of one column are separated by respective dielectric filled trenches 72, 73 and 74. The diffusions in each column are, however, connected together by a conductive line above the surface 47 of the substrate 45. The diffusions 101, 104, 105 and 106 of one column, for example, are each electrically connected to a conductive bit line 49 that is preferably made of doped polysilicon. Adjacent parallel conductive bit lines 51 and 53 similarly contact each of the diffusions in their respective columns.

The conductive lines 49, 51 and 53 can be made to have a much higher level of conductivity than that of elongated diffusions used in prior arrays as bit lines. This allows contacts between these bit lines and metal lines (not shown) strapping these bit lines to be spaced further apart along their lengths than is the case when elongated diffusions are used as the bit lines. Further, the ion density, width and other characteristics of the individual diffusions are optimized for operation of the memory cells without having to tailor these characteristics so that they also adequately function as electrical conductive bit lines. These conductive bit lines are preferably formed from another layer of doped polycrystalline silicon that is deposited over the entire surface and then removed to leave the separate, spaced-apart conductors, as described further below. The connection of one of the columnar bit lines 49 to a number of source/drain regions 104–106 etc. across isolation dielectric regions 72–74 etc. is illustrated in the isometric view of FIG. 7. Each of the source/drain regions of the memory array are preferably connected to a bit line in this way. The individual bit lines may be segmented along their lengths. Each memory cell source/drain region in a column is preferably connected to a common bit line or series of two or more bit line segments.

The bit line decoder and driver circuit 13 (FIG. 1) is connected through lines 15 and metal interconnections (not shown) with all of the bit line conductors of the array, including the lines 49, 51 and 53 of FIGS. 2 and 3. The sources and drains of columns of individual memory cells are thereby connected to proper programming voltages for either reading or programming in response to addresses supplied over the bus 25 and control signals over the lines 19.

Steering gates 81–86 are elongated in the y-direction and are spaced apart in the x-direction to individually overlay different columns of floating gates. The steering gates are formed by etching a second layer of gate material, also preferably doped polysilicon, that is deposited across the entire array over the first polysilicon layer with an appropriate inter-poly dielectric layer therebetween. The steering gate decoder and driver circuit 21 (FIG. 1) connects through lines 23 to all the steering gates and is able to individually control their voltages in response to addresses provided on the bus 25, control signals in the lines 33, and data from the drivers and sense amplifiers 13.

Word lines 91–94 are elongated in the x-direction and extend over the steering gates with spaces between them in the y-direction to position each word line in alignment with a row of floating gates. The word lines are formed by etching a third gate material layer of doped polysilicon that is deposited over the entire surface on top of an inter-poly dielectric that is first formed over the second polysilicon layer. Each of the word lines has gate elements periodically spaced along its length, one for each cell of its row. An example is the gate element 97, which extends downward toward the substrate surface 47 to act as a gate of a select transistor of the memory cell formed between the diffusions 101 and 102. The word lines allow selection of all the memory cells in its row for reading or writing. The select gate decoder and driver circuit 19 (FIG. 1) is connected with each word line in order to individually select one row of the cell array. Individual cells within a selected row are then enabled for reading or writing by the bit line and steering gate decoder and driver circuits 13 and 21.

The floating gates of the memory array can be erased to either the substrate 45 or to erase gates, depending upon how the array is designed. The word line gates of the embodiment being described can also serve as such erase gates. The gate 97, for example, can perform to erase its memory cell if it is appropriately field coupled with opposing edges of its floating gates 56 and 57.

Although this type of memory array will likely be referenced as a "triply poly" type, because each of the three sets of gates are made from polysilicon layers, it may be more accurate to refer to it as a "four poly" structure because the conductive bit lines are preferably made from an additional polysilicon layer. Alternately, other suitable electrically conductive materials may be used in place of one or more of the four polysilicon layers described above. The third gate material layer, for example, from which the word lines and select gates are formed, may be a polycide material, which is polysilicon with a conductive refractive metal silicide, such as tungsten, included on its top in order to increase its conductivity.

Not shown in FIGS. 2–4 are the metal conductor layers. Since the polysilicon elements usually have a conductivity that is significantly less than that of metal, metal conductors are included in separate layers, with connections made to the polysilicon elements periodically along their lengths. In order to reduce the number of metal conductors, adjacent pairs of steering gates straddling two neighboring cells can be connected together to single metal conductors. The steering gates 81 and 82, for example can be combined, as can steering gates 83 and 84. Since the steering gates of each pair are from adjacent memory cells, the system of operating the memory then places a voltage on each pair that is required for performing a desired operation on the addressed one of the adjacent memory cells. The other of the adjacent pair of memory cells is not affected since voltages necessary to perform a desired operation are not present on the other elements of that cell. Otherwise, there is a one-to-one correspondence between the number of metal lines and the number of polysilicon elements.

Additional details of the memory array of FIGS. 2 and 3 are given in the cross-sectional views of FIGS. 4–6. The single memory cell illustrated in FIG. 4 includes the two floating gates 56 and 57 positioned to extend slightly over respective source and drain diffusions 101 and 102, and coupled to the substrate surface 47 through a gate dielectric layer 111. The word line gate 97 is positioned between the floating gates, in the middle of the cell, and is coupled to the substrate surface 47 through a gate dielectric layer 113. A channel in the substrate 45 between the diffusions 101 and 102 includes three transistors in series, two L1 floating gate transistors and one L2 select transistor. An electrical equivalent circuit of this memory cell is given in FIG. 8, wherein corresponding elements are identified by the same reference numbers but with a prime (') added.

If the floating gates of the memory cells are erased to the word line gates, a thin tunnel dielectric layer 115 is positioned between edges of the floating gates 56 and 57 and the gate 97 in the cell of FIG. 4. That is what is illustrated by the dashed lines of the FIG. 8 equivalent circuit. However, if the memory cells are erased to the substrate, the dielectric layer 115 is made to be much thicker in order to minimize the coupling between the floating and word line gates. Indeed, the steering gates 82 and 83 are separated from the word line gate 97 by relatively thick spacers 117. Similarly, the bit lines 49 and 51 are separated from adjacent floating and steering gates by relatively thick spacers 119 in order to minimize any coupling between them. Vertically, an inter-poly dielectric layer 121, positioned between the floating and steering gates, is made thin enough in order to provide the desired level of coupling between the two gates. A relatively thick dielectric layer 123 separates the steering gates and word lines, where high isolation and an absence of coupling are normally desired. Similarly, the bit lines 49 and 51 are separated from the word line 91, in order to be led from it, by a dielectric layer 125.

A method of forming the array structure of FIGS. 2–8 is illustrated by sequential cross-sectional views of FIGS. 9–12. These are views of the memory array portion of an integrated circuit die. Other circuit portions peripheral to the array, such as decoders, voltage supply circuits and the like, are not shown. Although it is desired to carry out as many of the process steps together as practical to form the array and peripheral circuits, each is typically formed with a different set of processing steps while the other is temporarily masked for its protection.

Referring initially to FIGS. 9A and 9B, the state of the array structure after an initial number of process steps have been performed is given in orthogonal sections through the structure. A first number of steps forms the dielectric filled trenches 72, 73, etc. in the substrate surface 47. A mask (not shown) in the pattern of the trenches is positioned on the substrate surface 47 to define the trenches with an elongation in the x-direction and spaced apart in the y-direction. The trenches and the spaces between them can be formed in the y-direction to be as small as possible within the limits of the processing technology, at the minimum line width. An example minimum line width of current technology is 0.21 micron, for example. The trenches are then etched through that mask to a depth sufficient to provide the desired level of isolation, 4000 Angstroms being an example. The mask is then removed and a thick layer of dielectric, such as an oxide 8000 Angstroms thick, is deposited by a chemical-vapor-deposition (CVD) technique over the entire array and into the etched trenches. The dielectric on the surface of the wafer is then removed, a process of chemical-mechanical-polishing (CMP) being preferred to do this, in order to leave the dielectric in the trenches. The result is shown in FIGS. 9A and 9B.

A next series of steps forms a first doped polysilicon layer in strips 131, 133, 135 etc. across the substrate surface 47 with the gate dielectric layer 111 therebetween. These strips are oriented with their lengths extending in the x-direction and are positioned in the y-direction to lie between the dielectric filled trenches. The gate dielectric layer 111 is preferably an oxide that is initially grown over all of the array substrate surface 47 to a thickness, for example, within a range of from about 100 to 300 Angstroms. A first layer of polysilicon (to become the strips 131, 133, 135 etc.) is then deposited on the layer 111 over the entire array surface to a thickness of about 800 Angstroms, for example. This first polysilicon layer is later separated into the individual floating gates by three separate etching steps.

Prior to the first etching step, however, a thick dielectric layer is deposited on the polysilicon and etched through a mask (not shown) to form strips 141 having lengths extending in the x-direction and positioned as nearly as possible in the y-direction to be coincident with the substrate regions between the dielectric filled substrate trenches 72, 73, 74 etc. This layer is preferably silicon nitride material ($Si_3N_4$) with a thickness of about 2000 Angstroms. The strips 141 provide a mask used for the first etching step of the first polysilicon layer. But before etching the polysilicon, the mask openings are narrowed below the processing minimum line width by forming spacers 143 along the edge of the dielectric strips. The spacers 143 are formed by a well known process, after the strips 141 have been made, of depositing a thick dielectric layer over the entire array and then anisotropically etching this layer away to remove it from the top of the dielectric strips 141. In an example of this layer, its thickness is about 500 Angstroms and the material is also silicon nitride. This leaves the spacers 143 with a width that is related to the thickness of the strips 141 and thus provides apertures between them with a controlled width that is less than the minimum processing line width. The first polysilicon layer and the gate oxide layer 111 are then etched through the mask formed by the strips 141 and spacers 143, to result in the intermediate structure, illustrated in FIGS. 9A and 9B, having the first polysilicon layer strips 131, 133, 135 etc. This polysilicon etch mask of strips 141 and spacers 143 is then removed (not shown) before proceeding with the next series of steps.

Although the subsequent steps of etching the first polysilicon layer described below are self-aligned with other elements of the array, it will be noted that the polysilicon strips 131, 133, 135 etc. are not self-aligned in the y-direction with the substrate dielectric filled trenches 72, 73, 74 etc. The mask forming the dielectric strips 141 is lithographically aligned with the substrate trenches that have already been formed. But this is not critical since overlap of the trenches by the polysilicon strips 131, 133, 135 etc. in the y-direction (see FIG. 9B) allows some misalignment of those masks without adverse effects.

Next, a series of steps forms the steering gates 81–84 etc. from a second polysilicon layer, and associated layers of dielectric, as illustrated in FIGS. 10A, 10B and 10C. First, an inter-poly dielectric layer 121 is formed on the exposed top surfaces of the first polysilicon layer strips 131, 133, 135 etc. In a specific example, oxide is grown on the exposed polysilicon surfaces to a thickness of about 50 Angstroms, a layer of silicon nitride is then conformably deposited to a thickness of about 160 Angstroms over that, and, finally, the exposed silicon nitride surface is oxidized. This results in a oxide-nitride-oxide (ONO) dielectric layer.

Next, a second layer of polysilicon is deposited over the area of the array to a thickness of about 1000 Angstroms. A dielectric layer 151 is then formed across the second polysilicon layer, an example being a 500 Angstrom thick layer formed by a LPTEOS process. Another dielectric layer 153 is then formed on top of that, this further layer being a 1000 Angstrom thick layer of silicon nitride, for example. The structure including the second polysilicon layer and its three associated dielectric layers is then etched together through a mask (not shown) into strips having lengths extending in the y-direction, with widths and spacing between them in the x-direction that may be made as small as the processing allows. This intermediate state of the structure is that illustrated in FIGS. 10A, 10B and 10C. The strips 151 and 153 of dielectric substantially stay in place in the completed array.

A next series of processing steps is illustrated by FIG. 11. A temporary mask of an appropriate material, such as photoresist, is formed to cover every other space between the steering gates. One element 155 of that mask is shown in FIG. 11, being elongated in the y-direction, other such elements being spaced apart in the x-direction by a distance equal to twice that of the distance between centers of the steering gates in the x-direction. The first polysilicon strips 131, 133 and 135 (FIGS. 10A, 10B and 10C), as well as the underlying gate oxide layer 111, are then etched away, down to the substrate surface 47, through the remaining every other space between steering gates that are not covered by the mask including the strip 155. Segments 163 of the first polysilicon strips remain. This is the second etch of the first polysilicon layer and the first that separates the first polysilicon layer in the x-direction. It will be noted that one edge of each steering gate serves to position and form the openings through which the first polysilicon layer is etched in this step, thus providing self-alignment between one edge of each of the steering gates and resulting floating gates.

Next, a beam 159 of ions, such as arsenic ions, is directed against the array area to form ion implants 161 in the substrate surface 47. The ion beam is blocked by the structure on the surface 47 and by the dielectric in the substrate trenches 72, 73, 74 etc. The result is a two dimensional pattern of discrete ion implant areas that periodically recur across the substrate in the x-direction (as shown in FIG. 11) and which are separated in the y-direction by the dielectric filled substrate trenches.

After the source/drain implants, the photoresist mask, including the strip 155, is removed. The spacers 117 and 119 are then formed on the side walls of the exposed openings, as illustrated in FIG. 12. These spacers may, for example, be formed from a 300 Angstrom thick layer of silicon nitride that is anisotropically etched. The spacers 117 narrow the width in the x-direction of the openings intermediate of the source/drain regions, through which the first polysilicon strips, such as the strip 163 (FIG. 11), is later etched, and also isolates the later formed erase gates from adjacent steering gates.

Before that etching step, however, in the embodiment being described, a layer of polysilicon is deposited over the cell array to a thickness of about 3000 Angstroms, as an example. The polysilicon on top of the structure is then removed, such as by etching or CMP, leaving what is shown in FIG. 12. This includes the desired elongated bit lines, including the parallel polysilicon strips 49 and 51. It also results in temporary strips, including the strip 157, being formed in the trenches bounded by the spacers 117 and mid-way between the bit lines in the x-direction. The spacers 119 insulate the bit lines 49 and 51 from adjacent floating and steering gates.

The layer of polysilicon forming the bit lines is preferably doped to a density of from 1E15 to 10E15 of arsenic or phosphorous ions, either as the polysilicon is being deposited (in situ) or by implant after undoped polysilicon is deposited. The resulting bit lines 49 and 51 individually make electrical contact with those of the source and drain regions 161 in a column. Polysilicon is preferred for the bit line strips over metal, which has a higher conductivity, because the most suitable metals cannot withstand the high temperatures normally used in subsequent processing steps.

A next step is to deposit a dielectric layer 125 (FIG. 13) over the entire array. A layer about 1500 Angstroms thick, deposited by an LPTEOS process is preferred. A mask 154, such as one of photoresist material, is then formed over the array with openings over the polysilicon strips 157 that are positioned in between the bit lines. These openings are elongated in the y-direction and spaced apart in the x-direction. The areas of the dielectric layer 125 that are exposed through these openings are first removed. Thereafter, the polysilicon plugs 157 are removed by etching through those same mask openings. The etchant and the materials of the spacers 117 and the dielectric layer 153 are chosen to resist this polysilicon etch. The etching is continued to remove the portions of the first polysilicon layer strips, such as the strip 56, that are exposed between the spacers 117. This is the third and final etching step of the first polysilicon layer, which separates the strips, such as strip 163 (FIG. 12) into individual floating gates, such as the floating gates 56 and 57 (FIG. 13). Since the spacers 117 are formed along edges of the second polysilicon steering gates, this floating gate etch is self aligned to those steering gate edges. Both edges of the steering gates are thus used to align the second and third etching steps, respectively, of the first polysilicon layer.

It is often desirable to adjust the threshold level of the select transistor that is formed intermediate of the bit lines in the x-direction. Before forming the gate of the select transistor between the spacers 117, therefore, an implant 160 step may be performed. The photoresist mask 154 is then removed.

Referring to FIG. 14, the layer 113 of gate oxide is then formed on the substrate surface 47 with a thickness of about 250 Angstroms, in one example, by a combination of oxide growth and deposition. A layer is formed over the entire structure as the result of carrying out this step but only the gate oxide 113 and resulting layers 115 of tunnel dielectric formed of interest are shown. It may also be possible for the layers 113 and 115 to be formed in separate, sequential steps.

A third layer of gate polysilicon (fourth and last polysilicon layer overall) is then deposited over the array structure shown in FIG. 14, to a thickness of about 1000 Angstroms, for example, which, when patterned and etched, provides the word lines 91–94 etc. shown in FIGS. 2–4. Voltages placed on a word line, and thus on the select transistor gates that are part of the word line, such as the gate 97, control whether current is allowed to conduct through their respective memory cell's channels during reading and writing of the array. Floating gates of a row of memory cells along a word line are erased to the select transistor gates through the associated tunnel dielectric layers positioned between them.

The various polysilicon layers described above may be doped according to existing techniques. One such technique is to dope the polysilicon in situ, as it is being deposited. Another is to first deposit undoped polysilicon and then dope it by ion implantation.

The embodiment has been shown and described with respect to FIGS. 2–14 to include two floating gates per memory cell, between individual pairs of source and drain diffusions. Alternatively, three or more floating gates may be included in the individual memory cells with a single select transistor.

Single Floating Gate Memory Cell Array Embodiment

Referring to FIG. 15, an array of memory cells is briefly described wherein the individual cells contain only one floating gate between their source and drain regions. As in the previously described dual floating gate embodiment, rows of cells are separated by dielectric filled trenches 203, 204, 205 etc. that extend in the x-direction across a surface 201 semiconductor substrate 200. Source and drain regions 207–210 etc. are in one row that includes floating gates 213–217 etc. Bit lines 221–224, extending in the y-direction, are formed from a second polysilicon layer after the floating gates have been fully etched out of the first polysilicon layer. After that, from a third polysilicon layer, are formed word lines 231–234 etc. that extend in the x-direction. Finally, from a fourth polysilicon layer, are formed erase lines 241–245 etc. that extend in the y-direction. The erase lines have erase gates, such as the gate 251, extending into spaces between the floating gates of the rows in order to erase them. Alternately, the erase lines can be oriented with their lengths extending in the x-direction and positioned in the y-direction in between the word lines.

The memory cell embodiments described above include floating gates as their storage elements. However, it will be recognized that other types of non-volatile electron or field storage elements could be substituted instead, with the architectural and processing features described above also applying to such memory arrays. Indeed, it will be understood that the present invention is entitled to protection within the full scope of the appended claims.

It is claimed:

1. A non-volatile memory formed on a substrate, comprising:

an array of non-volatile memory cells including a plurality of rows of cells extending in a first direction across the substrate and being separated in a second direction by spaces therebetween, the first and second directions being orthogonal with each other, the cells individually including source/drain regions on opposite sides of at least one electron storage element in said first direction that are shared with adjacent cells of the same row, strips of dielectric material elongated in the first direction and extending into the substrate in the spaces between the rows of cells in order to provide electrical isolation between the memory cells of adjacent rows including isolation of their source/drain regions in said second direction, first electrically conductive strips elongated in the second direction and spaced apart in the first direction coincident with a plurality of adjacent source/drain diffusions, the first conductive strips individually extending across and contacting source/drain regions of a plurality of adjacent rows of cells and the dielectric material strips therebetween, and second electrically conductive strips positioned above the substrate and individually including gates therealong that are elements of adjacent memory cells.

2. A non-volatile memory of claim 1 formed on a substrate, comprising:

an array of non-volatile memory cells including a plurality of rows of cells extending in a first direction across the substrate and being separated in a second direction by spaces therebetween, the first and second directions being orthogonal with each other, the cells individually including source/drain regions on opposite sides of at least one electron storage element in said first direction that are shared with adjacent cells of the same row, wherein the memory cells individually include at least two electron storage elements positioned between adjacent ones of the source/drain regions, strips of dielectric material elongated in the first direction and extending into the substrate in the spaces between the rows of cells in order to provide electrical isolation between the memory cells of adjacent rows including isolation of their source/drain regions in said second direction, first electrically conductive strips elongated in the second direction and spaced apart in the first direction coincident with a plurality of adjacent source/drain diffusions, the first conductive strips individually extending across and contacting source/drain regions of a plurality of adjacent rows of cells and the dielectric material strips therebetween, and second electrically conductive strips positioned above the substrate and individually including gates therealong that are elements of adjacent memory cells, the second electrically conductive strips being elongated in the first direction with their said gates positioned in spaces between electron storage elements and in between adjacent ones of the first conductive strips in said first direction.

3. The memory of either one of claims 1 or 2, wherein the strips of dielectric material have been deposited in trenches formed in the substrate between adjacent rows of memory cells.

4. The memory of either one of claims 1 or 2, wherein the first electrically conductive strips are formed of doped polycrystalline silicon.

5. A non-volatile memory formed on a substrate, comprising:

an array of non-volatile memory cells including a plurality of rows of cells extending in a first direction across the substrate and being separated in a second direction by spaces therebetween, the first and second directions being orthogonal with each other, the cells individually including source/drain regions on opposite sides of at least one electron storage element in said first direction that are shared with adjacent cells of the same row, wherein the memory cells individually include a single electron storage element positioned between adjacent ones of the source/drain regions, strips of dielectric material elongated in the first direction and extending into the substrate in the spaces between the rows of cells in order to provide electrical isolation between the memory cells of adjacent rows including isolation of their source/drain regions in said second direction, first electrically conductive strips elongated in the second direction and spaced apart in the first direction coincident with a plurality of adjacent source/drain diffusions, the first conductive strips individually extending across and contacting source/drain regions of a plurality of adjacent rows of cells and the dielectric material strips therebetween, and second electrically conductive strips positioned above the substrate and individually including gates therealong that are elements of adjacent memory cells, wherein the second electrically conductive strips are elongated in the second direction and positioned in the first direction between the first electrically conductive strips.

6. A non-volatile memory formed on a substrate, comprising:

an array of non-volatile memory cells including a plurality of rows of cells extending in a first direction across the substrate and being separated in a second direction by spaces therebetween, the first and second directions being orthogonal with each other, the cells individually including source/drain regions on opposite sides of at least one electron storage element in said first direction that are shared with adjacent cells of the same row, strips of dielectric material elongated in the first direction and extending into the substrate in the spaces between the rows of cells in order to provide electrical isolation between the memory cells of adjacent rows including isolation of their source/drain regions in said second direction, first electrically conductive strips elongated in the second direction and spaced apart in the first direction coincident with a plurality of adjacent source/drain diffusions, the first conductive strips individually extending across and contacting source/drain regions of a plurality of adjacent rows of cells and the dielectric material strips therebetween, and second electrically conductive strips positioned above the substrate and individually including gates therealong that are elements of adjacent memory cells, wherein the gates of the second electrically conductive strips are erase gates individually positioned to have a charge removal coupling with a memory cell electron storage element.

7. A non-volatile memory formed on a substrate, comprising:

an array of non-volatile memory cells including a plurality of rows of cells extending in a first direction across the substrate and being separated in a second direction by spaces therebetween, the first and second directions being orthogonal with each other, the cells individually including source/drain regions on opposite sides of at least one electron storage element in said first direction that are shared with adjacent cells of the same row, wherein the memory cells individually include a select transistor between the electron storage element and one of its source/drain regions, strips of dielectric material elongated in the first direction and extending into the substrate in the spaces between the rows of cells in order to provide electrical isolation between the memory cells of adjacent rows including isolation of their source/drain regions in said second direction, first electrically conductive strips elongated in the second direction and spaced apart in the first direction coincident with a plurality of adjacent source/drain diffusions, the first conductive strips individually extending across and contacting source/drain regions of a plurality of adjacent rows of cells and the dielectric material strips therebetween, and second electrically conductive strips positioned above the substrate and individually including gates therealong that are elements of adjacent memory cells, wherein the gates of the second electrically conductive strips individually form gates of the select transistors.

8. A non-volatile memory formed on a substrate, comprising:

an array of non-volatile memory cells including a plurality of rows of cells extending in a first direction across the substrate and being separated in a second direction by spaces therebetween, the first and second directions being orthogonal with each other, the cells individually including source/drain regions on opposite sides of at least one electron storage element in said first direction that are shared with adjacent cells of the same row, wherein the electron storage elements are floating gates, strips of dielectric material elongated in the first direction and extending into the substrate in the spaces between the rows of cells in order to provide electrical isolation between the memory cells of adjacent rows including isolation of their source/drain regions in said second direction, first electrically conductive strips elongated in the second direction and spaced apart in the first direction coincident with a plurality of adjacent source/drain diffusions, the first conductive strips individually extending across and contacting source/drain regions of a plurality of adjacent rows of cells and the dielectric material strips therebetween, and second electrically conductive strips positioned above the substrate and individually including gates therealong that are elements of adjacent memory cells.

9. An array of rows and columns of non-volatile memory cells that individually include at least two floating gates positioned along a row with a select transistor between them and a source and a drain on opposite sides of the at least two floating gates, wherein the rows of memory cells are electrically isolated from one another by trenches in the substrate between them that are filled with a dielectric material and the sources and the drains of the memory cells are interconnected by doped polycrystalline silicon lines extending in a direction along columns across the isolation dielectric material between rows, and word lines extending along rows above the polycrystalline silicon lines are connected to gates of the select transistors.

10. The array of claim 9, wherein the gates of the select transistors are also coupled with floating gates in a manner to erase electrons therefrom.

11. An array formed on a substrate of rows and columns of non-volatile memory cells that individually include at least two floating gates positioned along a row with a select transistor between them and source and drain regions on opposite sides of the at least two floating gates that are shared with adjacent cells along the row, wherein the rows are electrically isolated from one another along the substrate in a column direction by dielectric between the rows, wherein the source and drain regions are interconnected by conductive lines with lengths oriented in the column direction to contact the source and drain regions and isolation dielectric between them, and word lines extending along rows of cells that have select transistor gates therealong.

12. The array of claim 11, wherein the rows of memory cells are electrically isolated from one another by trenches between them into the substrate that are filled with a dielectric material.

13. The array of claim 11, wherein the word lines are positioned above the source and drain region interconnecting lines.

14. An array of non-volatile memory cells on a semiconductor substrate, comprising:

a two-dimensional array of floating gates arranged in rows extending in a first direction across the substrate with spaces therebetween in a second direction and columns extending in the second direction across the substrate with spaces therebetween in the first direction, said first and second directions being orthogonal with each other, a first set of spaces separating the columns of floating gates including ones of every other space across the substrate in the first direction and a second set of spaces separating the columns of floating gates including remaining ones of every other space across the substrate in the first direction and in between the first set of spaces, source and drain diffusions spaced apart in the first direction across the substrate along the rows and coincident with the first set of spaces between columns of floating gates, elongated electrically conductive bit lines having lengths extending across the substrate in the second direction within the first set of spaces between columns of floating gates, said bit lines individually extending over and electrically contacting a plurality of said diffusions in adjacent rows, elongated steering gates having lengths extending across the substrate in the second direction and being spaced apart in the first direction to overlay columns of floating gates with said second set of spaces positioned between adjacent steering gates, and elongated select gates having lengths extending across the substrate in the first direction and spaced apart in the second direction to overlay rows of floating gates, said select gates extending into said second set of spaces with capacitive coupling with floating gates adjacent the second set of spaces.

15. The memory cell array of claim 14, wherein the source and drain diffusions are electrically isolated from one another in the second direction by strips of dielectric elongated in the first direction and spaced apart in the second direction to be positioned between the rows of floating gates.

16. The memory cell array of claim 15, wherein the strips of dielectric include trenches in the substrate that are elongated in the first direction and spaced apart in the second direction to be positioned between the rows of floating gate, and a dielectric deposited in said trenches.

17. The memory of any one of claims 14-16, wherein the first electrically conductive strips are formed of doped polycrystalline silicon.

* * * * *